United States Patent
Nagy et al.

(10) Patent No.: US 6,714,771 B1
(45) Date of Patent: Mar. 30, 2004

(54) BROADCAST RADIO SIGNAL SEEK CIRCUIT

(75) Inventors: Louis Leonard Nagy, Warren, MI (US); Douglas Courtney Martin, Warren, MI (US); Anthony E Kaczor, Fenton, MI (US); Janalee Ann Graham, Linden, MI (US)

(73) Assignee: Delphi Technologies, Inc., Troy, MI (US)

( * ) Notice: Subject to any disclaimer, the term of this patent is extended or adjusted under 35 U.S.C. 154(b) by 474 days.

(21) Appl. No.: 09/712,457

(22) Filed: Nov. 14, 2000

(51) Int. Cl.$^7$ .................................................. H04B 1/18
(52) U.S. Cl. ................................ 455/161.3; 455/193.1; 455/193.5
(58) Field of Search ........................... 455/161.1, 161.2, 455/161.3, 32, 77, 145, 174.1, 182.1–182.3, 183.2, 184.1, 185.1, 186.1, 193.1, 195.1; 348/731, 732, 733

(56) References Cited

U.S. PATENT DOCUMENTS

| | | | |
|---|---|---|---|
| 5,073,975 A | | 12/1991 | Zarabadi et al. ............. 455/161 |
| 5,506,906 A | * | 4/1996 | Herrmann ....................... 381/4 |
| 5,613,230 A | * | 3/1997 | Gottfried et al. ......... 455/161.3 |
| 5,740,523 A | * | 4/1998 | Nakajima et al. ......... 455/186.1 |
| 5,842,119 A | * | 11/1998 | Emerson et al. .......... 455/161.3 |
| 5,949,280 A | * | 9/1999 | Sasaki ........................ 329/303 |
| 6,021,320 A | | 2/2000 | Bickford et al. .......... 455/186.1 |
| 6,493,544 B1 | * | 12/2002 | Baxley et al. ............. 455/161.1 |

* cited by examiner

Primary Examiner—Duc M. Nguyen
(74) Attorney, Agent, or Firm—Stefan V. Chmielewski

(57) ABSTRACT

A broadcast radio frequency receiver includes an improved seek circuit receiving analog radio signals via an antenna according to a signal seek process wherein the frequency of the analog radio signals sequentially changes. In one embodiment, an analog-to-digital (A/D) converter converts the magnitudes of the incoming radio signals to digital signal values (DV), and in an alternate embodiment a tuning circuit provides the digital signal values (DV) directly. In either case, a digital control circuit compares the digital signal values (DV) with a digital reference value (DRV), wherein DRV has a value corresponding to an analog signal reference level appropriate for the type of antenna being used. As long as the digital signal values are less than DRV, the seek process continues. Upon detection of a digital signal value in excess of DRV, the seek process is halted and the tuning circuit is allowed to maintain tuning to the current radio signal. By maintaining the seek threshold has a digital value, it may easily and quickly be changed to accommodate antenna systems having different antenna gain characteristics.

4 Claims, 2 Drawing Sheets ent shortcomings of the prior art are addressed
BROADCAST RADIO SIGNAL SEEK CIRCUIT

TECHNICAL FIELD

The present invention relates generally to broadcast radio signal receiving systems, and more specifically to such systems including a seek function operable to sequentially search a band of radio frequencies for broadcast signals above a predefined signal strength.

BACKGROUND OF THE INVENTION

Electronic circuits for controlling operation of a broadcast radio receiver are known and have been widely implemented in both home and automotive entertainment systems. One such electronic circuit provides a so-called "seek" function operable to sequentially (i.e., either incrementally or decrementally) search a band of radio frequencies for broadcast signals above a predefined signal strength. Typically, such a circuit is responsive to operator selection of the seek function to search either forward or backward from the currently selected broadcast frequency, to identify as an available broadcast station the first broadcast frequency detected as having a signal strength greater than a predefined signal strength, and to tune the radio receiver to the identified broadcast frequency.

Referring to FIG. 1, an example of one known radio frequency receiver 10 is shown having an antenna 12 electronically connected to a tuning circuit 14 via signal path 16. An output of the tuning circuit 12 is connected to an input of a seek circuit 18 via signal path 22, wherein tuning circuit 14 provides an analog radio signal on signal path 22 having a magnitude corresponding to the signal strength of the currently tuned frequency. In this known embodiment, the seek circuit 18 is an analog circuit and includes (among other elements and functions) a comparator circuit 20 having a non-inverting input connected to signal path 22, an inverting input connected to an analog reference voltage VREF, and an output that is fed back to the tuning circuit 14 via signal path 24. A SEEK selector 26 is typically provided on the face plate (not shown) of RF receiver 10 and is electrically connected to seek circuit 18 via signal path 28. The tuning circuit 14 includes another output connected to an audio amplifier circuit (not shown) of RF receiver 10 via signal path 30 as is known in the art.

In normal operation of RF receiver 10, the tuning circuit 14 is operable to tune to a selected frequency, and to provide a corresponding radio signal to the amplifier circuit for audible reproduction of the signal content. During seek operation, in response to operator depression of the SEEK selector 26, seek circuit 18 provides a start signal to tuning circuit 14 via signal path 32. The tuning circuit 14 is responsive to the start signal on signal path 32 to modify, e.g., by either incrementing or decrementing, its tuning frequency and provide a radio signal corresponding thereto to comparator 20 on signal path 22. Comparator 20 is operable to compare the magnitude of the incoming analog radio frequency signal on signal path 22 with the predefined analog reference voltage VREF. As long as the magnitude of the analog radio frequency is less than VREF, the tuning circuit 14 continues to periodically increment or decrement its tuning frequency and pass an analog radio signal corresponding thereto to seek circuit 18. If, however, the magnitude of the analog radio frequency on signal path 22 is greater than VREF, the comparator 20 changes state and provides a stop signal to tuning circuit 14 via signal path 24. The tuning circuit 14 is responsive to the stop signal on signal path 24 to halt the seek process and allow reception by RF receiver 10 of radio signals corresponding to the current tuning frequency. In general, the magnitude of the analog reference voltage VREF in the system of FIG. 1 is typically set at a voltage level above which detected broadcast signals exhibit an acceptable reception quality.

While analog seek circuits of the type illustrated and described with respect to FIG. 1 have been widely used with a number of different antenna configurations (e.g., front mast, rear mast and active backlite antenna systems), they have been found to exhibit certain drawbacks associated therewith. For example, some antenna systems, such as a passive backlite antenna of the type described in co-pending U.S. Pat. No. 6,031,500, which is assigned to the assignee of the present invention and the contents of which are incorporated herein by reference, exhibit significantly lower RF signal gains than conventional antenna systems. While the lower signal gains of such antenna systems generally do not affect the signal-to-noise ratios of the incoming radio frequency signals, they will result in reduced RF signal strengths provided to tuning circuit 14, and accordingly reduced magnitude radio signals provided to seek circuit 18. The quality of reception is mainly dependent upon the signal-to-noise ratio of the received signals and is therefore not affected by lower antenna gains. However, the seek function is dependent only upon the magnitude of the radio signals provided thereto on signal path 22, and therefore is directly affected by the RF signal gain capability of antenna 12. Thus, while lower RF gain antenna systems may have similar quality of reception characteristics across a broadcast frequency band, conventional seek circuitry in receivers utilizing such antennas will typically not detect as many broadcast stations as in receivers utilizing higher RF gain antennas.

One solution to the foregoing drawback associated with low antenna gain RF signal receiving systems is to lower the seek level threshold; i.e., lower the analog reference voltage level VREF. However, while this technique increases the seek count for low RF gain antenna systems, it allows the tuning in of broadcast signals having lower than desired reception quality in systems having higher gain antenna systems. Difficulty accordingly arises when interchanging antenna systems between low and high RF gain antennas. Moreover, circuit changes required to establish different VREF levels for different antenna gains are expensive and difficult to track in a production environment. What is therefore needed is an improved seek threshold strategy that is adaptable to a wide range of antenna RF signal gains and is easily modified in a production environment.

SUMMARY OF THE INVENTION

The foregoing shortcomings of the prior art are addressed by the present invention. In accordance with one aspect of the present invention, a radio frequency receiver including a signal seek function comprises a tuning circuit operable in a seek mode to receive and provide radio signals sequentially changing in frequency, means for producing digital signal values corresponding to magnitudes of the radio signals, means for producing a digital reference value corresponding to a reference signal magnitude, and means for producing a stop signal upon detection of a first one of the digital signal values exceeding the digital reference value, wherein the tuning circuit is responsive to the stop signal to halt the seek mode and maintain tuning thereof to a radio signal corresponding to the first one of the digital signal values.

In accordance with another aspect of the present invention, a method of seeking radio frequency signals comprises the steps of conducting a seek process by receiving radio signals sequentially changing in frequency, providing magnitudes of received ones of the radio signals as digital signal values, comparing each of the digital signal values with a digital reference value, and halting the seek process upon detection of a first one of the digital signal values exceeding the digital reference value and allowing reception of radio signals corresponding to the first one of the digital signal values.

One object of the present invention is to provide an improved radio signal seek strategy that is adaptable to a wide range of antenna RF signal gains.

Another object of the present invention is to provide an improved seek threshold circuit that accomplishes these and other objectives.

These and other objects of the present invention will become more apparent from the following description of the preferred embodiment.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
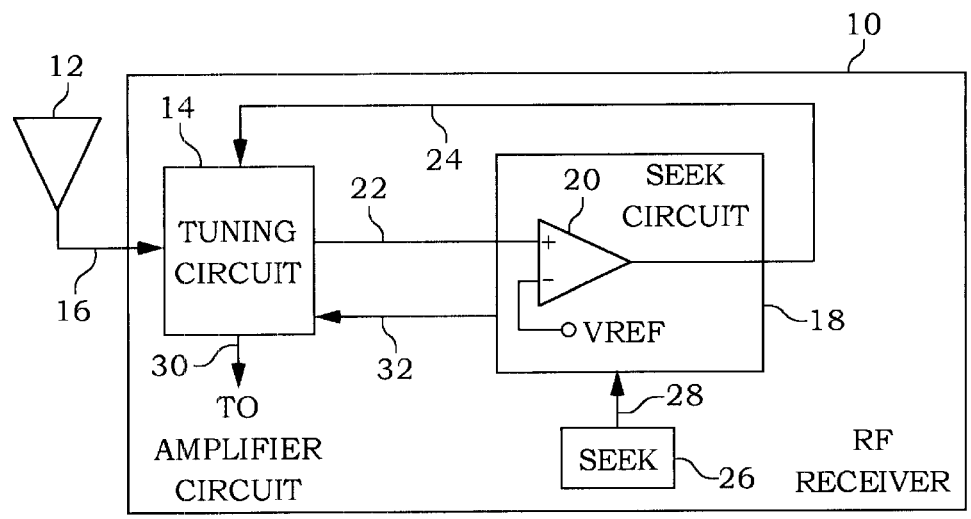
FIG. 1 is a block diagram of a prior art radio frequency receiver including known analog seek threshold circuitry.
Figure 2:
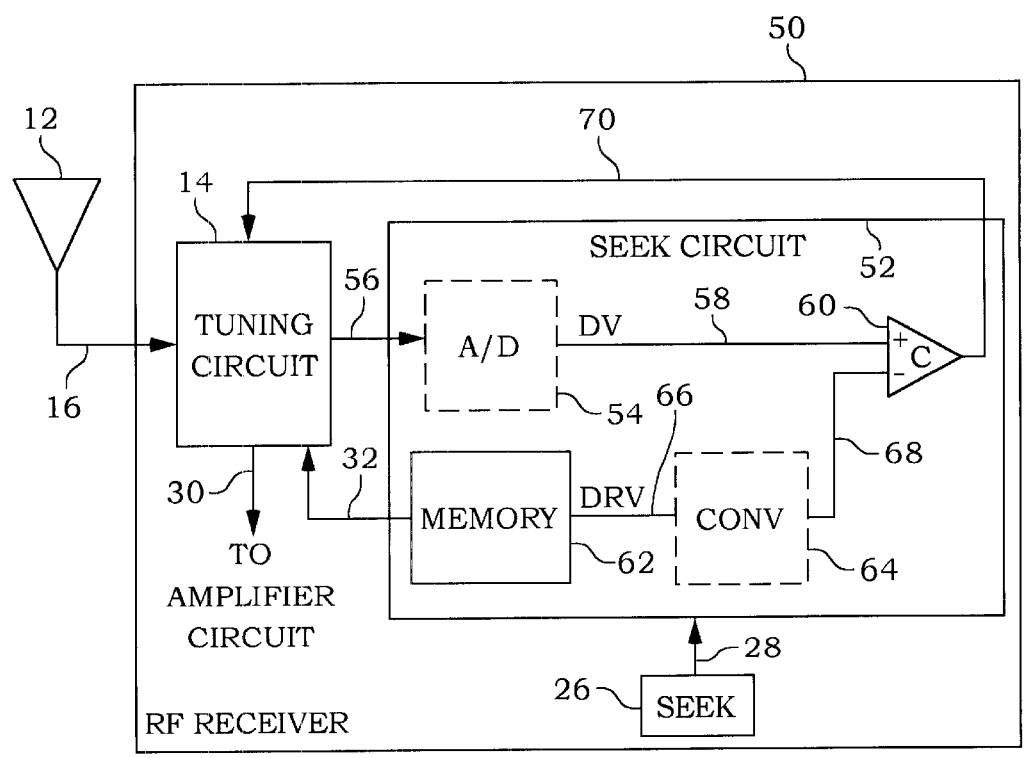
FIG. 2 is a block diagram of a radio frequency receiver incorporating an improved seek threshold circuit, in accordance with the present invention.

Referring now to FIG. 2, one preferred embodiment of a broadcast radio frequency receiver 50 is shown incorporating therein an improved seek threshold circuit, in accordance with the present invention. The radio frequency receiver 50 is identical in many respects to the radio frequency receiver 10 of FIG. 1 with the exception of at least the seek threshold portion of the seek circuit 52. Radio frequency receiver 50 may accordingly otherwise be of known construction having an antenna 12 electrically connected to a tuning circuit 14 via signal path 16, wherein tuning circuit 14 may be identical to that shown and described with respect to FIG. 1. A first output of tuning circuit 14 is connected to a seek circuit 52 via signal path 56, and a second output is connected to an amplifier circuit (not shown) via signal path 30 as described with respect to FIG. 1.

Antenna 12 may be a known radio frequency antenna operable to receive broadcast radio frequency signals and provide such signals to tuning circuit 14. Examples of such known radio frequency antennas 12 for use with receiver 50 may include, but are not limited to, front mast, rear mast, active backlite and passive backlite antenna systems. In general, front mast, rear mast and active backlite antennas have higher RF signal gains as compared with passive backlite antennas, and the present invention is directed to seek thresholding techniques adaptable for use with such antenna systems having differing RF signal gain characteristics.

Receiver 50 may be selectively configurable, as is known in the art, to receive broadcast signals in either the AM or FM frequency bands, although it is to be understood that the concepts of the present invention are applicable to signal seeking techniques with signals in other frequency bands and with signals other than broadcast signals. As with receiver 10 of FIG. 1, receiver 50 includes a SEEK button or selector 26 electrically connected to seek circuit 52 via signal path 28, and seek circuit 52 includes a signal path 32 electrically connected to an input of tuning circuit 14.

In accordance with the present invention, a thresholding portion of seek circuit 52 is configured to compare a digital representation of the radio signal produced by tuning circuit 14 on signal path 56 with a programmable digital reference value, and to stop or halt the seek process when the digital representation of the radio signal provided on signal path 56 exceeds the programable digital reference value. In one preferred embodiment of seek circuit 52, the threshold portion thereof includes an analog-to-digital (A/D) converter 54 of known construction having an input electrically connected to signal path 56 and an output electrically connected to signal path 58. In this embodiment, tuning circuit 14 is configured to provide an analog radio signal on signal path 56 corresponding to a tuning frequency thereof, and A/D converter 54 is operable to process this analog radio signal and produce a digital signal having a digital value DV corresponding to a magnitude or strength of the RF signal on signal path 16. Alternatively, tuning circuit 14 may be configured to produce a digital radio signal on signal path 56 corresponding to a tuning frequency thereof, wherein the value of the digital radio signal corresponds to a magnitude or strength of the broadcast radio signal received on signal path 16. In this embodiment, A/D converter 54 may be omitted, and is accordingly shown in FIG. 2 in phantom, wherein the digital signal on signal path 56 is provided directly to signal path 58 as the digital value DV having a value corresponding to the magnitude or strength of the RF signal on signal path 16.

Seek circuit 52 is preferably microprocessor-based, and includes a memory 62 having stored therein one or more software algorithms for generally controlling the operation of seek circuit 52 in a manner known in the art. Memory 62 further has stored therein at least one digital signal reference value (DRV) and is operable to provide DRV on signal path 66.

Seek circuit 52 is illustrated in FIG. 2 as including two additional circuit blocks; namely a comparator block 60 having a non-inverting input receiving the digital signal value DV on signal path 58 and a conversion block 64 (shown in phantom) having an input receiving the digital reference value DRV on signal path 66 and output providing a corresponding digital output signal to the inverting input of comparator 60 via signal path 68. An output of comparator block 70 is electrically connected to an input of tuning circuit 14 and provides a stop signal thereto identical to the stop signal on signal path 24 of FIG. 1. It is to be understood that blocks 60 and 64 are not intended to represent physical circuitry within control circuit 52, but rather represent functional blocks that are executed by software preferably resident within memory 62. Thus, any data conversion performed by block 64, and any signal comparisons performed by block 60, are carried out via one or more software algorithms executed by a microprocessor portion of seek circuit 52.

With the exception of the seek threshold strategy provided by components 54, 60, 62 and 64, the overall seek function performed by seek circuit 52 is identical to the well known seek function performed by seek circuit 18 of FIG. 1. More specifically, seek circuit 52 is responsive to a seek request resulting from operator depression of the SEEK button or selector 26 to produce a seek start signal on signal path 32 as is known in the art. The tuning circuit 14 is responsive to the seek start signal on signal path 32 to enter a frequency seeking process by modifying a tuning frequency thereof. More specifically, the tuning circuit 14 is operable in the seek process to search radio frequencies in predefined frequency increments for signal content in either a forward frequency searching mode or a backward frequency searching mode. For example, the SEEK button or selector 26 typically includes a "Seek Up" option, wherein the tuning circuit 14 is operable to search in a forward frequency search mode starting from the currently selected frequency. Similarly, the SEEK button or selector 26 typically includes a "Seek Down" option, wherein the tuning circuit 14 is operable to search in a backward frequency search mode starting from the currently selected frequency. In either case, the seek circuit 52 is responsive to the seek request to produce a corresponding signal on signal path 32 to which the tuning circuit 14 is responsive to sequentially modify its tuning frequency to thereby receive analog radio signals incrementally changing (either up or down) in frequency via signal path 16, and produce corresponding radio signals on signal path 56 as is known in the art. In embodiments wherein the tuning circuit 14 produces analog radio signals on signal path 56, seek circuit 52 includes A/D converter block 54 operable to convert the incoming radio signal magnitude to a digital value DV and provide the digital value DV to the comparator block 60 as shown in FIG. 2. In alternative embodiments wherein the tuning circuit 14 produces digital radio signals on signal path 56, seek circuit 52 does not include A/D converter bock 54 and signal path 56 is connected directly to signal path 58 to thereby provide the digital radio signal directly to the comparator block 60.

In either case, a predefined or pre-programmed digital reference value DRV is provided by memory block 62 on signal path 66. In one embodiment, the conversion block 64 is omitted and the digital reference value DRV is chosen as a function of antenna type or as a function of antenna RF gain. Thus, for example, with high RF gain antennas such as front mast, rear mast, active backlite and the like, DRV is chosen to have a first digital value above which the magnitude of the incoming radio signal on signal path 16 has acceptable signal strength. By contrast, with lower RF gain antennas, such as passive backlite antennas, DRV is chosen to have a second digital value less than the first digital value to preferably allow reception of substantially the same broadcast frequencies as would occur with the higher gain antennas. In this embodiment, a number of DRV values may be programmed into memory 62, wherein each DRV value corresponds to a desired analog signal threshold level appropriate for separate antenna types. For example, if three antenna types, having three different signal gain characteristics, may possibly be used with receiver 50, memory 62 may accordingly include three separate DRV values therein. In this embodiment, seek circuit 52 may be programmed to identify a storage location within memory 62 corresponding to an appropriate one of the DRV values following final selection of antenna type. In any case, signal path 66, in this embodiment, is connected directly to signal path 68 such that memory block 62 is operable to provide an appropriate digital reference value DRV directly to comparator block 60.

In an alternate embodiment of seek circuit 52, the digital reference value DRV stored in memory block 62 is set to the first digital value as just described. In this embodiment, seek circuit 52 includes conversion block 64, wherein conversion block 64 includes a data conversion mechanism operable to convert the digital reference value DRV to a desired reference value depending upon the antenna type or on the RF gain of the antenna being used. Thus, for example, with high RF gain antennas such as front mast, rear mast, active backlite and the like, conversion block 64 provides for a 1:1 conversion such that the desired digital value produced at the output thereof is equal to DRV. By contrast, with lower RF gain antennas such as, for example, a passive backlite antenna, conversion block 64 preferably provides for a reduction of DRV from the first digital value to the lower second digital value. It is to be understood that the present invention contemplates providing conversion block 64 with any known data conversion mechanism including, but not limited to, one or more data tables, one or more equations, one or more graphs or the like. In one specific embodiment, conversion block includes an equation for mapping the input digital reference value DRV to the output desired reference value, wherein the equation is of the form desired reference value=DRV*antilog [(G1–G2)/20], wherein G1 is the RF signal gain (in dB) of the antenna being used and G2 is the RF signal gain (in dB) of the antenna used to establish DRV.

In any case, as long as the digital value DV has a value less than DRV (or desired reference value if seek circuit 52 includes conversion block 64), the tuning circuit 14 is operable to sequentially modify its tuning frequency as described hereinabove. If, however, the digital value DV is greater than DRV (or greater than the desired reference value if seek circuit 52 includes conversion block 64), the converter block 60 changes state and produces a stop signal on signal path 70. The tuning circuit 14 is responsive to the stop signal on signal path 70 to halt the seek process and allow reception by RF receiver 50 of the currently tuned radio frequency as is known in the art.

Figure 3:
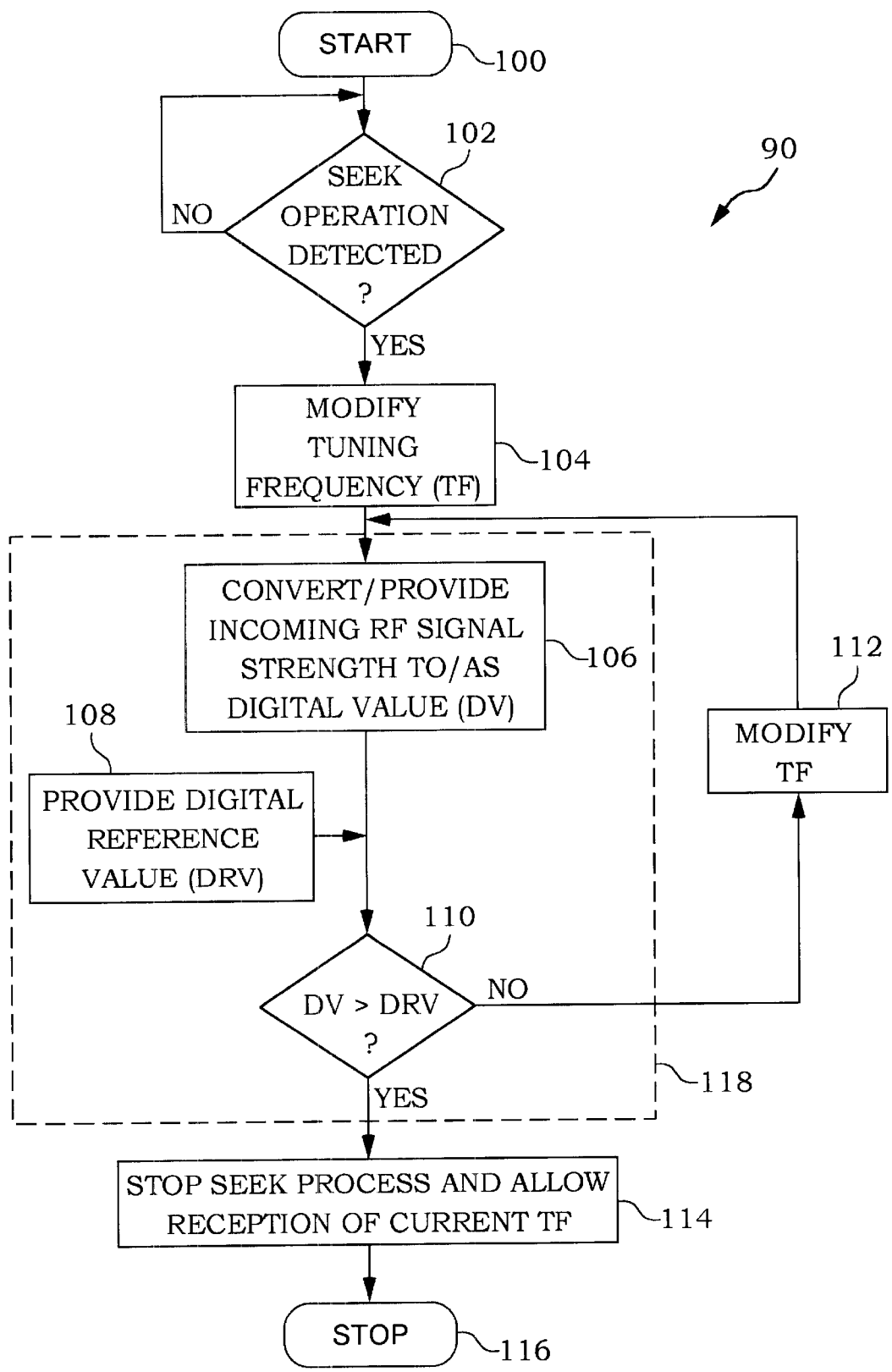
FIG. 3 is a flowchart illustrating one preferred embodiment of a process for performing an improved seek strategy, in accordance with the present invention.

Referring now to FIG. 3, a flowchart is shown illustrating one preferred embodiment of a software algorithm 90 for conducting a seek process with the radio signal receiver 50 of FIG. 2, wherein algorithm 90 includes an improved seek threshold process 118 in accordance with the concepts of the present invention. Algorithm 90 is preferably stored within memory 62 and is executable by a microprocessor resident within RF receiver 50. In any case, algorithm 90 begins at step 100, and at step 102 seek circuit 52 is operable to monitor SEEK button or selector 26 to determine whether seek operation has been requested. If not, algorithm execution loops back to step 100. If, however, seek circuit 52 determines at step 102 that the SEEK button or selector 26 has been depressed, and a request for seek operation has thereby been detected, algorithm 90 advances to step 104 where seek circuit 52 is operable to direct, via signal path 32, the tuning circuit 14 to modify its tuning frequency (TF), wherein TF is typically an incremental frequency above or below the currently selected frequency.

Following step 104, the seek circuit 52 is operable at step 106 to provide a digital value DV corresponding to the strength or magnitude of the incoming radio signal on signal path 16. In embodiments wherein tuning circuit 14 is operable to produce analog radio signals on signal path 56, seek circuit 52 includes A/D converter block 54 and seek circuit 52 is accordingly operable at step 106 to convert the analog radio signal on signal path 56 to a digital value DV having a value corresponding to the strength or magnitude thereof. However, in embodiments wherein tuning circuit 14 is operable to produce digital radio signals on signal path 56, seek circuit 52 does not include A/D converter block 54 and the tuning circuit 14 is accordingly operable at step 106 to provide the incoming RF signal strength as a digital value DV directly to comparator block 60.

Algorithm 90 is operable at step 108 to provide a digital reference value DRV (alternatively a desired reference value that is a function of DRV as described hereinabove). Both of the steps 106 and 108 advance to step 110 where the comparator block 60 is operable to compare DV with DRV (or to compare DV with the desired reference value). If DV>DRV (or the desired reference value), algorithm execution advances to step 114. If, however, DV<DRV (or the desired reference value), algorithm execution advances to step 112 where tuning circuit 14 is operable to modify its tuning frequency as described hereinabove. Algorithm loops from step 112 back to step 106.

At step 114, DV has been found to be greater than DRV (or the desired reference value), and the comparator block 60 is responsive to this condition to produce a stop signal on signal path 70. The tuning circuit 14 is responsive to this stop signal to stop or halt the seek process and allow reception by the RF receiver 50 of radio signals corresponding to the current tuning frequency. Algorithm 90 stops thereafter at step 116.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. A radio frequency receiver including a signal seek function comprising:

a tuning circuit operable in a seek mode to receive and provide radio signals sequentially changing in frequency;

means for producing digital signal values corresponding to magnitudes of said radio signals;

means for producing a digital reference value corresponding to a reference signal magnitude;

means for producing a stop signal upon detection of a first one of said digital signal values exceeding said digital reference value; and a signal antenna receiving and providing said radio signals to said tuning circuit;

wherein said digital reference value is a function of a type of said signal antenna;

and wherein said tuning circuit is responsive to said stop signal to halt said seek mode and maintain tuning thereof to a radio signal corresponding to said first one of said digital signal values.

2. The receiver of claim 1 wherein said signal antenna has a radio frequency signal gain associated therewith;

and wherein said digital reference value is a function of said radio frequency signal gain of said signal antenna.

3. A method of seeking radio frequency signals comprising the steps of:

conducting a seek process by receiving radio signals sequentially changing in frequency;

providing magnitudes of received ones of said radio signals as digital signal values;

comparing each of said digital signal values with a digital reference value;

receiving said radio signals via a signal antenna prior to the conducting step;

choosing said digital reference value as a function of a type of said signal antenna; and halting said seek process upon detection of a first one of said digital signal values exceeding said digital reference value and allowing reception of radio signals corresponding to said first one of said digital signal values.

4. The method of claim 3 further including the step of choosing said digital reference value as a function of a radio frequency signal gain of said antenna.

* * * * *